Aug. 27, 1963 J. W. THORNHILL 3,102,061
METHOD FOR THERMALLY ETCHING SILICON SURFACES
Filed Jan. 5, 1960
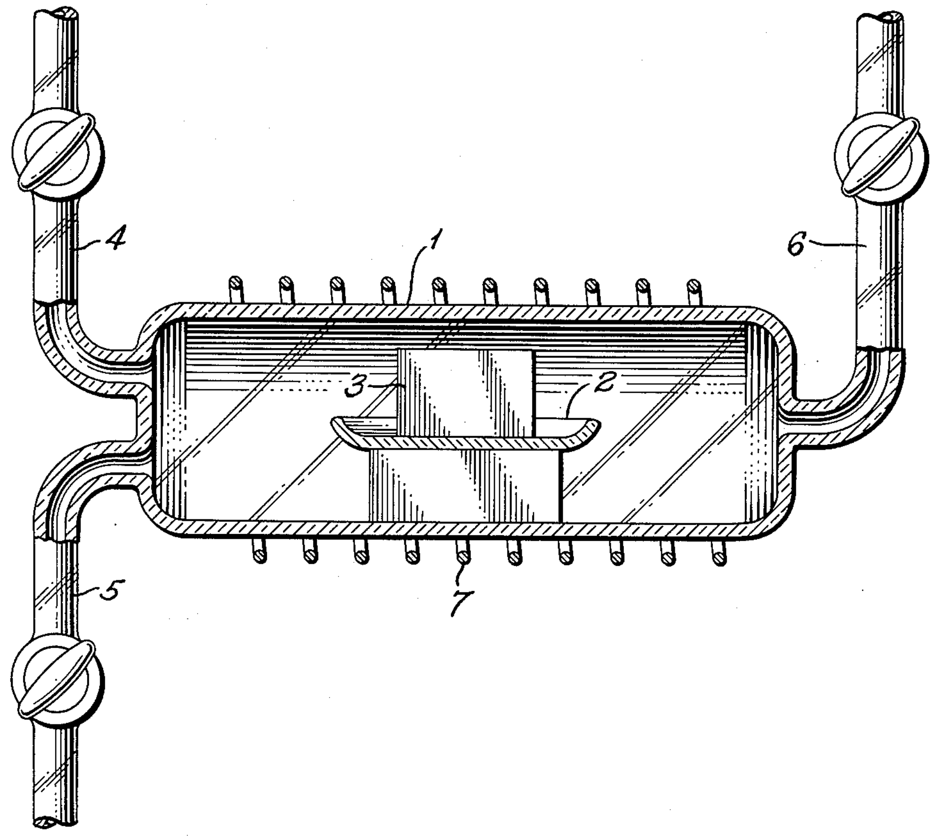
INVENTOR
*Jay W. Thornhill*
BY *Stevens, Davis, Miller & Mosher*
ATTORNEYS United States Patent Office 3,102,061
Patented Aug. 27, 1963

3,102,061
METHOD FOR THERMALLY ETCHING SILICON SURFACES

Jay W. Thornhill, Attleboro, Mass., assignor to Texas Instruments Incorporated, Dallas, Tex., a corporation of Delaware Filed Jan. 5, 1960, Ser. No. 653
2 Claims. (Cl. 156—17)

This invention relates to improvements in the preparation of semiconductor materials. More particularly, it relates to a method of cleaning semiconductor surfaces or removing a portion of a semiconductor surface utilizing a thermal etching technique.

In the preparation of semiconductor materials for use in electronic applications, one of the most important steps employed is that of etching. It has long been known to producers of semiconductor devices that proper etching of a semiconductor surface is required to produce devices having good characteristics. It is also well known that the etching process will remove the surface layer of material damaged by the preceding mechanical processes, usually sawing and lapping, used to subdivide a single crystal of semiconductor material into bars, wafers or the like. Furthermore, it is often desirable to clean semiconductor surfaces prior to performing diffusion or alloying operations.

The history of the semiconductor device art is well studded with investigations of etching solutions and their effects. Present practice utilizes etching or lapping operations which, though effective for many purposes, may leave unwanted by-products or debris on the surface that it is desired to clean.

The process of the present invention may be used to clean semiconductor surfaces prior to diffusion or alloying in a manner such that no by-products or debris remain on the cleaned surface of the semiconductor. Furthermore, the method of this invention permits a controlled reduction of the thickness of a semiconductor sample in a uniform manner, or alternatively, the reduction of the thickness of a diffused surface layer in a controlled uniform way.

The etching process of the present invention may be properly termed thermal etching. Broadly, the invention comprises heating a semiconductor sample under a reduced ambient gas pressure in the presence of a limited amount of oxygen so that a surface layer of monoxide is formed. The monoxide layer is then volatilized by maintaining the sample at a sufficiently high temperature and at reduced pressure. This removal of a portion of the surface of the semiconductor by conversion to a monoxide and volatilization of the latter is continued for a sufficient length of time to adequately clean the surface of the semiconductor, or if desired, to etch the semiconductor sample to a controlled depth.

Many advantages of the thermal etching technique of the present invention over chemical or electrolytic processes of the prior art will be readily apparent to those skilled in the art of semiconductor device fabrication. Thus, it is an object of the present invention to provide a method for cleaning the surface of silicon material in a manner which leaves no undesirable by-products or debris upon the surface.

It is a further object of this invention to provide a method for etching the surface of silicon material which does not require the use of chemical etchants or electrolytic etching techniques.

It is also an object of this invention to provide a method for etching silicon surfaces rapidly and efficiently.

It is a further object of the present invention to provide a method for uniformly removing silicon at the surface of a sample of solid silicon until the sample is at a desired thickness.

It is a further object of this invention to provide a method for removing a diffused layer at the surface of a solid silicon sample until the surface resistivity of the sample is at a desired value.

These and other objects of this invention will become apparent and be better understood from a further reading of the following disclosure taken in conjunction with the appended drawing in which the sole FIGURE depicts schematically an apparatus which may be utilized in the practice of the method of this invention.

Although the following description of the present invention is presented specifically as the invention pertains to silicon, it will be readily apparent to those skilled in the art that the principles herein disclosed are equally applicable to other semiconductor materials, such as, for example, germanium.

As shown in the sole FIGURE, a cylindrical container 1 of quartz or other suitable material contains a boat 2 of quartz on which is placed the silicon sample 3, the surface of which is to be cleaned. The container 1 is provided at one end with two conduits 4 and 5, the purpose of which will be presently explained. At its discharge end, container 1 is fitted with a third conduit 6. Surrounding the quartz container is a heating element 7 which may be a resistance heater, as depicted, or other heating means, as desired.

At the commencement of the process, the silicon sample is placed in the quartz boat 2 within the quartz cylinder 1. A gaseous atmosphere, which may be air, containing a limited amount of oxygen is admitted to the container 1 via conduit 5. The gaseous atmosphere should contain less than 20% oxygen in order that the semiconductor will not form the dioxide. The pressure of the gas within the container is reduced by appropriate means (not shown) connected to one of conduits 4, 5, or 6. At the outset, the pressure within container 1 is reduced to approximately $10^{-3}$ mm. of Hg and the heating element 7 is energized. Upon heating the silicon sample, the exposed surface of the sample reacts with the oxygen present in the container to form silicon monoxide at the surface. As the temperature is increased to above 1100° C., the silicon monoxide will volatilize, leaving the surface of the sample exposed and capable of further reaction with any additional oxygen which is present. The rate of etching will be proportional to the amount of oxygen which is available in the atmosphere established within container 1, assuming the oxygen level is too low to allow the formation of the dioxide, and the etching will proceed until the oxygen has been exhausted or the temperature is reduced.

Several methods of stopping the etching process at the desired points are available. For example, the process may be completed by evacuating the container to a very low pressure, thus removing the oxygen supply while cooling the sample. In this manner, undesirable residual oxygen, in excess of the amount required to accomplish the extent of etching desired, is evacuated from the container, and at the same time, the sample temperature is lowered below that at which the reaction resulting in the formation of silicon monoxide will proceed.

As an alternative to evacuation and cooling, the chamber 1 may be back-filled with a gas which will not react with the silicon and which does not contain any oxygen. A simple way of doing this is to heat the silicon in a "fore vacuum" pressure to about 1150° C. and allow the etching to progress for the period of time required for the depth of etching desired, and then to back-fill and flush the chamber 1 with a gas, such as argon. Another useful method is to heat the silicon in a high vacuum chamber to 1150° C. and use a controlled leak to introduce a gas, such as argon, containing a very low percentage of oxygen. By this method, the etch rate is proportional to the rate of admission of the gas containing the oxygen and when the etching has proceeded to the extent desired, the leak is stopped to end the etching process.

The following examples of results obtained utilizing the thermal etching technique of the present invention are intended as illustrative and not as limiting insofar as values for temperatures, pressures, and times, and also types of materials may be specified therein.

*Example I*

A sample of solid silicon was placed on a boat located in a quartz tube. The sample was 0.250 in. by 0.250 in. by 0.020 in. thick, and was roughened by a sawing process used in forming the sample.

The quartz tube was evacuated to a pressure of $10^{-3}$ mm. of mercury. Oxygen for the reaction was that present in the residual air in the tube. The temperature within the tube was then gradually increased to 1150° C., and this temperature and pressure were then maintained constant for ten hours. The pressure in the quartz container was then reduced to $10^{-6}$ mm. of Hg, and the silicon sample was simultaneously cooled to 25° C. The silicon sample was then removed from the quartz cylinder and its surface examined. It was observed that the surfaces of the sample were glossy and considerably smoother than when the sample was placed in the tube. The sample thickness had been reduced to 0.016 in.

*Example II*

A sample of solid silicon of the same size and a surface condition similar to the sample of Example I was treated in the manner set forth in Example I except that after the sample had been heated at $10^{-3}$ mm. of Hg at 1150° C. for ten hours, the vacuum pumps were shut off, and the oxygen containing gaseous mixture (air) was flushed from the quartz tube and replaced with inert argon gas to thereby raise the pressure within the quartz tube to atmosphere pressure. The sample was then cooled to room temperature, removed from the tube and quartz boat, and inspected. The exposed surfaces of the sample were glossy and considerably smoother than they were prior to the termal etching. The thickness of the sample had been reduced by 0.004 in.

Several alternative steps within the framework of the over-all method of the present invention have been described or suggested hereinabove. Other possible minor modifications within the generic thermal etching concept of this invention will occur to those skilled in the art, and are considered to be within the spirit of the invention, which is to be limted only as set forth in the appended claims.

What is claimed is:

1. A method of etching solid silicon which comprises locating the silicon to be etched in a gaseous mixture containing less than about 20% oxygen and the remainder gases which are unreactive with silicon, reducing the pressure of said gaseous mixture to less than $10^{-3}$ mm. of mercury, heating the silicon to a temperature of about 1150° C., maintaining said pressure and temperature for approximately ten hours, and then introducing an inert gas to the gaseous mixture to thereby raise the pressure of the gaseous mixture to atmospheric pressure.

2. A method of etching solid silicon which comprises locating the silicon to be etched in a chamber evacuated to $10^{-6}$ mm. of mercury, heating the silicon to approximately 1150° C., allowing a gaseous mixture composed of less than 20% oxygen and the remainder gases inert to silicon to leak into said chamber at a rate proportional to the rate of etching desired, and finally stopping the leaking of said gaseous mixture into said chamber when the desired amount of etching is completed.

References Cited in the file of this patent

UNITED STATES PATENTS

| | | |
|---|---|---|
| 2,744,000 | Seiler | May 1, 1956 |
| 2,768,914 | Buehler et al. | Oct. 30, 1956 |
| 2,802,760 | Derick et al. | Aug. 13, 1957 |
| 2,841,477 | Hall | July 1, 1958 |
| 2,950,220 | Genser et al. | Aug. 23, 1960 |
| 2,961,354 | Cleveland | Nov. 22, 1960 |
| 2,992,080 | Herrick | July 11, 1961 |